United States Patent
Hwang et al.

(10) Patent No.: US 10,281,508 B2
(45) Date of Patent: May 7, 2019

(54) METHOD AND APPARATUS FOR AUTOMATED ELECTRICITY DEMAND RESPONSE BASED ON ONLINE TRADING OF DEMAND SIDE RESOURCES

(71) Applicant: ELECTRONICS AND TELECOMMUNICATIONS RESEARCH INSTITUTE, Daejeon (KR)

(72) Inventors: Tae In Hwang, Daejeon (KR); Il Woo Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 515 days.

(21) Appl. No.: 15/092,761

(22) Filed: Apr. 7, 2016

(65) Prior Publication Data

US 2016/0314481 A1 Oct. 27, 2016

(30) Foreign Application Priority Data

Apr. 22, 2015 (KR) .................. 10-2015-0056510
Sep. 3, 2015 (KR) .................. 10-2015-0124829

(51) Int. Cl.
- *G01R 21/133* (2006.01)
- *G06Q 30/02* (2012.01)
- *G06Q 50/06* (2012.01)
- *G06Q 10/04* (2012.01)
- *H02J 3/00* (2006.01)

(Continued)

(52) U.S. Cl.
CPC ......... *G01R 21/133* (2013.01); *G01R 22/063* (2013.01); *G05B 15/02* (2013.01); *G06Q 10/043* (2013.01); *G06Q 30/0202* (2013.01); *G06Q 50/06* (2013.01); *H02J 3/006* (2013.01); *H02J 2003/003* (2013.01); *Y04S 10/50* (2013.01); *Y04S 50/14* (2013.01)

(58) Field of Classification Search
None
See application file for complete search history.

(56) References Cited

U.S. PATENT DOCUMENTS 9,134,353 B2 * 9/2015 Jia .................. G06Q 40/04
2010/0076835 A1 * 3/2010 Silverman .......... G06Q 10/06
705/14.33

(Continued)

FOREIGN PATENT DOCUMENTS

KR 10-2012-0114435 A 10/2012
KR 10-2013-0082756 A 7/2013

(Continued)

*Primary Examiner* — Gurkanwaljit Singh
(74) *Attorney, Agent, or Firm* — LRK Patent Law Firm

(57) ABSTRACT

An apparatus for automated electricity demand response based on online trading of demand side resources. The apparatus includes a communication unit, a demand response management system, an utility grid management system, and a demand response resources in use; a database; and a demand response processing unit configured to receive an electricity demand reduction instruction message according to a certain demand response service contract condition in the demand response management system.

12 Claims, 4 Drawing Sheets

(51) Int. Cl.
  *G05B 15/02* (2006.01)
  *G01R 22/06* (2006.01)

(56) References Cited

U.S. PATENT DOCUMENTS

| | | | |
|---|---|---|---|
| 2010/0332373 A1* | 12/2010 | Crabtree | G06Q 40/04 705/37 |
| 2011/0040666 A1* | 2/2011 | Crabtree | G06Q 30/0283 705/37 |
| 2012/0150454 A1 | 6/2012 | Lee et al. | |
| 2013/0035992 A1* | 2/2013 | Silverman | G06Q 30/0233 705/14.1 |
| 2013/0218356 A1 | 8/2013 | Lee et al. | |
| 2013/0245847 A1* | 9/2013 | Steven | G06Q 50/06 700/291 |
| 2014/0297206 A1* | 10/2014 | Silverman | G01R 22/063 702/58 |
| 2015/0094968 A1* | 4/2015 | Jia | G06Q 40/04 702/60 |

FOREIGN PATENT DOCUMENTS

| | | |
|---|---|---|
| KR | 10-2014-0140198 A | 12/2014 |
| KR | 10-2015-0064771 A | 6/2015 |

\* cited by examiner

METHOD AND APPARATUS FOR AUTOMATED ELECTRICITY DEMAND RESPONSE BASED ON ONLINE TRADING OF DEMAND SIDE RESOURCES

CROSS-REFERENCE TO RELATED APPLICATION

This application claims the benefit of priority to Korean Patent Application No 10-2015-0056510, filed on Apr. 22, 2015 and No. 10-2015-0124829, filed on Sep. 3, 2015 in the Korean Intellectual Property Office, the disclosure of which is incorporated herein in its entirety by reference.

BACKGROUND OF THE INVENTION

Field of the Invention

The present disclosure relates to a method and an apparatus for automated electricity demand response, and more particularly, to a method and an apparatus for automated electricity demand response that can relieve the inconvenience and the inaccuracy of the existing off-line electricity demand reduction operation and the difficulty of real time response, by automatically reducing an electricity consumption prepared for customer baseline load in an electricity consumer area such as shops, factories into a contract demand response capacity, based on online trading of demand side resources, through a demand response contract of a demand response contractor with a demand response service provider in a smart grid environment.

Description of the Related Art

Conventionally, between a demand response service provider and a demand response contractor, when accomplishing an electricity demand reduction instruction of the demand response service provider, the contractor directly controls demand side resources existing in a demand response contractor site through an off-line instruction. In order to enhance an accuracy of a target achievement according to the reduction instruction, an amount of actual demand response should be calculated based on an amount of electricity measurement for each measurement time to readjust a demand response resources operation plan.

However, such a manual operation is too complicated and cumbersome for a person to perform, and a real time response is difficult. In addition, if a problem, such as a lack of demand response resources owned by the contractor, occurs, and it is expected that it is difficult to achieve the target amount of demand response, an aid of external demand response resources should be required. However, such an aid may not be properly prepared.

SUMMARY OF THE INVENTION

The present disclosure has been made in view of the above problems, and provides a method and an apparatus for automated electricity demand response which can predict a maximum demand response capacity after on-line determining a reserve electricity of demand response resources and an available amount of electricity reduction, in an electricity consumer area such as shops and factories of a smart grid environment, automatically reduce an electricity consumption prepared for load into a contract demand response capacity according to the prediction, secures a shortfall through an electricity purchase of external demand response resources from a trading market of demand response resource, automates an electricity demand response to automatically achieve a target value of contract demand response capacity by efficiently controlling an available demand response resources through the calculation of demand response capacity for each measurement time, is able to use simultaneously and control the available demand response resources and the external demand response resource, and can exceed the contract amount, of demand response by securing the shortfall of demand response capacity that may occur due to unexpected accident such as abnormal operation of the demand response resources owned by the demand response contractor through the trading market of demand response resource.

In accordance with another aspect of the present disclosure, an apparatus for automated electricity demand response based on online trading of demand side resources includes: a communication unit configured to support a communication with a demand response market system, a demand response management system, an utility grid management system, and a demand response resources in use, which are connected each other on a network; a database configured to store electricity measurement information related to the demand response resources collected from the utility grid management system or the demand, response resources through the communication unit, and store demand response resources state information for the demand response resources collected from the demand response resources through the communication unit; and a demand response processing unit configured to receive an electricity demand reduction instruction message according to, a certain demand response service contract condition in the demand response management system according to an electricity demand reduction request notified from the demand response market system, monitor a state of the demand response resources and perform a demand response process, and set an electricity demand reduction and electricity generation schedule with reference to the electricity measurement information so that an electricity consumption according to an operation of the demand response resources may be a demand response capacity target value or less to perform an on-line control process for the operation of the demand response resources, wherein the demand response processing unit compares the demand response capacity target value with a maximum demand response capacity prediction value to determine whether to purchase an electricity for an external demand response resource, and request to purchase the electricity to the demand response market system to secure an amount of a shortfall of the demand response capacity.

The demand response capacity target value is a value arbitrarily set by a user or a value previously set through a contract with a demand response service provider.

The demand response processing unit includes a demand response capacity calculation unit configured to calculate a maximum demand response capacity prediction value as a maximum electricity consumption to be consumed during a given period, with reference to the demand response resources state information, and store the prediction value in the database; an external demand response resources electricity purchasing unit configured to determine whether to purchase an electricity for the external demand response resources by comparing the demand response capacity target value with the maximum demand response capacity prediction value; and a demand response resources state monitoring and control unit configured to set the electricity demand reduction and electricity generation schedule according to the demand response process to perform the on-line control process for the operation of the demand response resources, with respect to all demand response resources in use, while including the external demand response resources purchased by the external demand response resources electricity purchasing unit.

The demand response capacity target value is higher than the maximum demand response capacity prediction value, wherein the external demand response resources electricity purchasing unit transmits and receives certain data after connecting communication with the demand response market system through the communication unit, and request and purchase the electricity of the external demand response resources.

The demand response resources state monitoring and control unit sets the electricity demand reduction and electricity generation schedule including an operation time for each time with respect to the all demand response resources in use to control an operation of the demand response resources, when information on electricity price for each time according to the service contract condition is included in the electricity demand reduction instruction message.

The demand response resources state monitoring and control unit performs the control for the demand response process, wherein the demand response capacity calculation unit compares an actual demand response capacity for each measurement time calculated according to the electricity measurement information with a preset target value for each measurement time, and determines whether to repeat to calculate the maximum demand response capacity prediction value.

In accordance with another aspect of the present disclosure, a method for automated electricity demand response based on online trading of demand side resources includes storing electricity measurement information related to a demand response resources collected from an utility grid management system on a network or a demand response resources in use in a database, and storing the demand response resources state information for the demand response resources collected from the demand response resources in the database; receiving an electricity demand reduction instruction message according to a certain demand response service contract condition in a demand response management system on the network according to an electricity demand reduction request notified from a demand response market system on the network, and monitoring a state of the demand response resources and performing a demand response process, and setting an electricity demand reduction and electricity generation schedule with reference to the electricity measurement information so that an electricity consumption according to an operation of the demand response resources may be a demand response capacity target value or less and performing an on-line control process for the operation of the demand response resources, wherein performing an on-line control process for the operation of the demand response resources comprises comparing the demand response capacity target value with a maximum demand response capacity prediction value to determine whether to purchase an electricity for an external demand response resource, and requesting to purchase the electricity to the demand response market system to secure an amount of a shortfall of the demand response capacity.

The demand response capacity target value is a value arbitrarily set by a user or a value previously set through a contract with a demand response service provider.

Performing an on-line control process for the operation of the demand response resources includes: calculating a maximum demand response capacity prediction value as a maximum electricity consumption to be consumed during a given period, with reference to the demand response resources state information; determining whether to purchase an electricity for the external demand response resources by comparing the demand response capacity target value with the maximum demand response capacity prediction value; and setting the electricity demand reduction and electricity generation schedule according to the demand response process to perform the on-line control process for the operation of the demand response resources, with respect to all demand response resources in use, while including the external demand response resources purchased by the external demand response resources electricity purchasing unit.

When the demand response capacity target value is higher than the maximum demand response capacity prediction value, determining whether to purchase an electricity includes transmitting and receiving certain data, after connecting communication with the demand response market system through the communication unit, and requesting and purchasing the electricity of the external demand response resources.

Performing an on-line control process for the operation of the demand response resources includes setting the electricity demand reduction and electricity generation schedule including an operation time for each time with respect to the all demand response resources in use to control an operation of the demand response resources, when information on electricity price for each time according to the service contract condition is included in the electricity demand reduction instruction message.

When performing the control for the demand response process in performing an on-line control process, calculating a maximum demand response capacity prediction value includes comparing an actual demand response capacity for each measurement time calculated according to the electricity measurement information with a preset target value for each measurement time, and determining whether to repeat to calculate the maximum demand response capacity prediction value.

BRIEF DESCRIPTION OF THE DRAWINGS

The objects, features and advantages of the present disclosure will be more apparent from the following detailed description in conjunction with the accompanying drawings, in which.

DETAILED DESCRIPTION OF EXEMPLARY EMBODIMENTS

Exemplary embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

Figure 1:
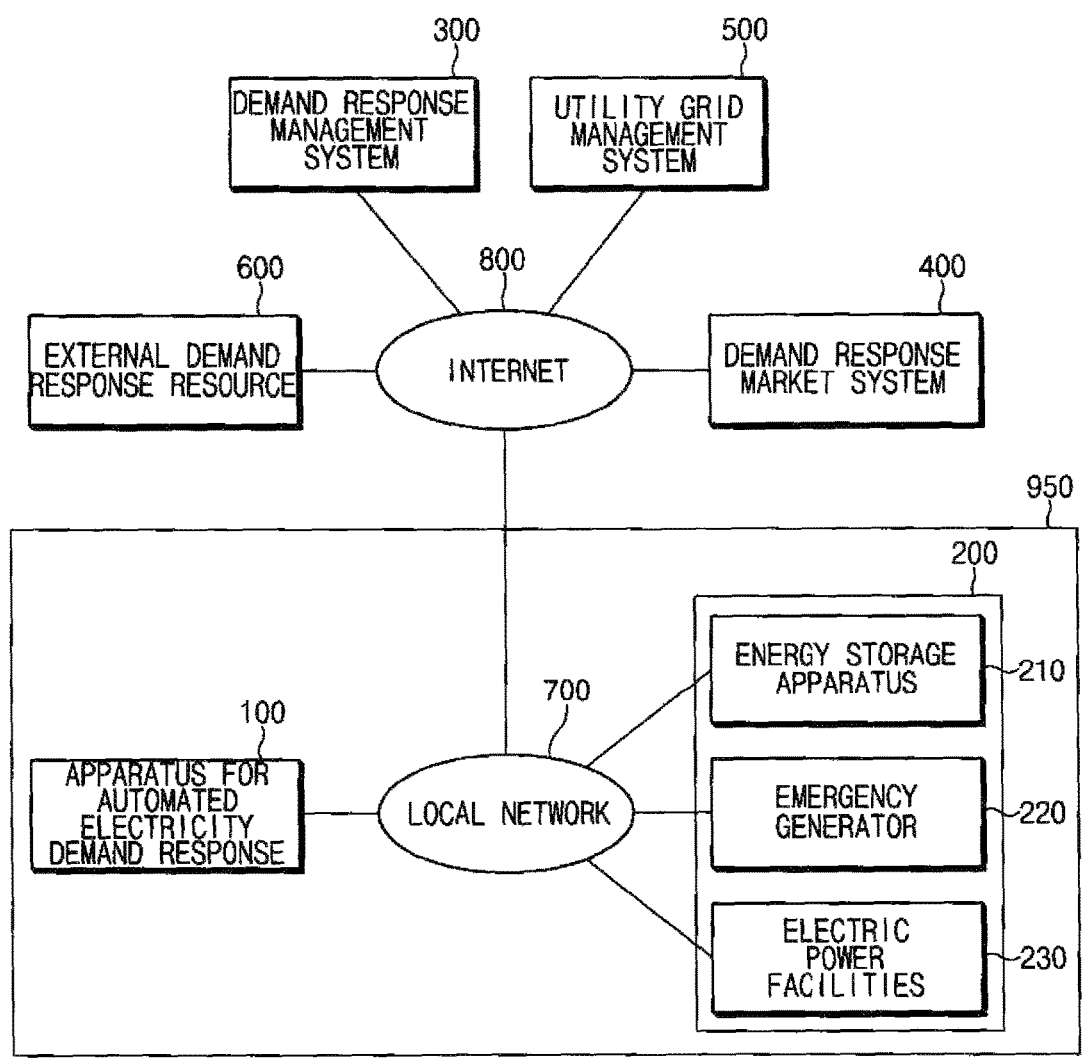
FIG. 1 is a diagram illustrating a smart grid system which includes an apparatus for automated electricity demand response based on online trading of demand side resources according to an embodiment of the present disclosure.

FIG. 1 is a diagram illustrating a smart grid system 900 which includes an apparatus 100 for automated electricity demand response based on online trading of demand side resources according to an embodiment of the present disclosure.

Referring to FIG. 1, the smart grid system 900 according to an embodiment of the present disclosure may include a demand response management system 300, a demand response market system 400, an utility grid management system 500, an external demand response resources 600, and a demand response customer site 950, which are connected through a communication network 800 such as Internet.

The demand response customer site 950 may include the apparatus 100 for automated electricity demand response configured to on-line control a demand response resources 200 based on a demand response capacity for each electricity consumption measurement time and an actual demand response capacity, and the demand response resources 200 for generating electricity to supply to an electricity consuming load, such as an energy storage apparatus 210, an emergency generator 220, and an electric power facilities 230 which can be on-line controlled through the apparatus 100 for automated electricity demand response, which are connected and associated with each other and are able to communicate necessary information, via a local network 700 (Internet, WiFi, a mobile communication network, a dedicated network, etc.) connected with the communication network 800 such as Internet. The energy storage apparatus 210 may store electricity generated by using a renewable energy source such as solar power, wind power, tidal power, and the like.

The external demand response resources 600 may be an individual demand response resources of a demand response service provider such as other customers or suppliers that exist outside of the demand response customer site 950. The energy storage apparatus (the electricity generated by using the renewable energy source may be stored), the emergency generator, the electric power facilities supplied with electricity from an electricity company may generate electricity to supply to the electricity consuming load, and the reduced electricity or the surplus electricity may be sold through the demand response market system 400. When the external demand response resources 600 is dealt through the demand response market system 400 and is purchased in the demand response customer site 950, the demand response customer site 950 may remotely control on-line the purchased external demand response resources 600 and may be able to measure the electricity production or the consumption for corresponding individual demand response resources.

The utility grid management system 500 may be combined with the communications technology and perform an utility grid function that efficiently manages an electrical grid between an electricity consumer such as a power supply company and demand response customers on the smart grid system, and relay and efficiently supply the electricity such as the external demand response resources 600, and the demand response resources 200 of the demand response customer site 950 to the electricity consumer. In particular, while performing the electrical grid management as described above, the utility grid management system 500 may monitor the electrical status consumed in the demand response customer site 950, and may provide information on an amount of electricity measurement for each electricity measurement time.

The demand response market system 400 may relay an electricity trading such as the external demand response resources 600 owned by the demand response service provider, and the demand response resources 200 of the demand response customer site 950, and may manage information related to the electricity trading such as a seller, a buyer, demand response resources information related to a corresponding purchased electricity, and a service contract condition related to the demand response. The demand response market system 400 may notify an electricity demand reduction request (message) to the demand response management system 300, depending on the situation for example, seasonal factors such as summer, winter, and market factors such as increased demand or decreased demand, with reference to the service contract conditions for the demand response.

The demand response management system 300 may perform a sale request for the electricity deal of the external demand response resources 600 through the demand response market system 400 and the approval far the buyer, may set and manage a service contract condition far the demand response at the time of electricity trading of the external demand response resources 600, and transmit an electricity demand reduction instruction to the demand response customer site 950 which purchased external demand response resources 600 by determining the matching of the demand response service contract condition, when receiving the electricity demand reduction request (message) from the demand response market system 400.

Figure 2:
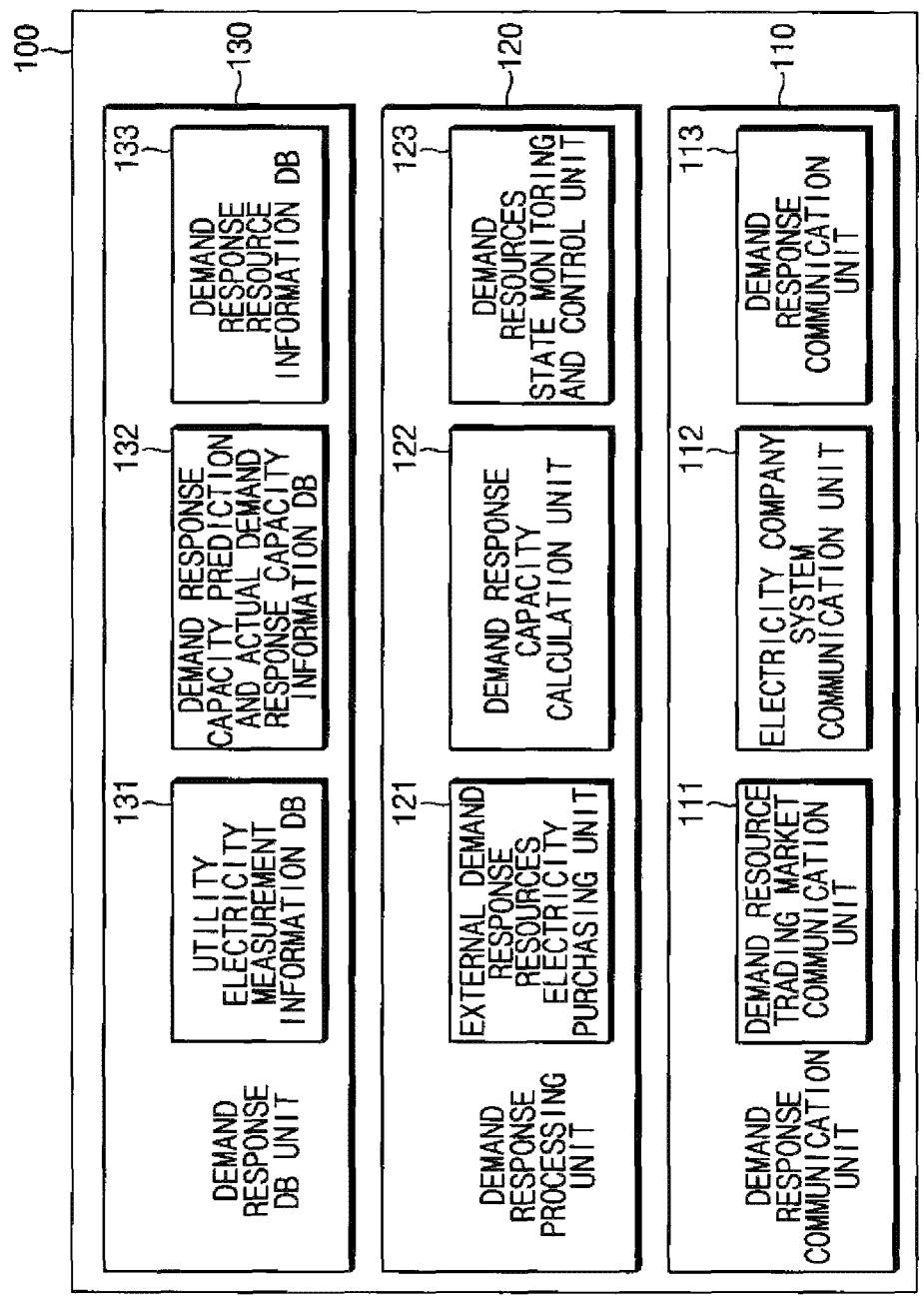
FIG. 2 is a detailed block diagram illustrating an apparatus for automated electricity demand response based on online trading of demand side resources according to an embodiment of the present disclosure.

FIG. 2 is a detailed block diagram illustrating an apparatus 100 for automated electricity demand response based on online trading of demand side resources according to an embodiment of the present disclosure. Here, it is described with reference to FIG. 3.

Referring to FIG. 2, the apparatus 100 for automated electricity demand response based on online trading demand side resources according to an embodiment of the present disclosure may include a demand response communication unit 110, a demand response processing unit 120, and a demand response database (DB) unit 130. Each element of the apparatus 100 for automated electricity demand response may be implemented by a hardware such as a semiconductor processor, a software such as an application, or a combination thereof.

The demand response communication unit 110 may include a demand response resource trading market communication unit 111, an electricity company system communication unit 112, a demand response resources communication unit 113, and the like.

The demand response resources trading market communication unit 111 may be provided with a module to communicate with the demand response market system 400 for the purchase of the external demand response resources 600.

The electricity company system communication unit 112 may be provided with a module to receive an electricity demand reduction instruction message from the demand response management system 300 or receive information on electricity measurement from the utility grid management system 500.

The demand response resources communication unit 113 may be provided with a module to communicate with the demand response resources (200, including the purchased external demand response resources 600).

The demand response DB unit 130 may include an utility electricity measurement information DB 131, a demand response capacity prediction and actual demand response capacity information DE 132, and a demand response resources information DB 133.

The utility electricity measurement information DB 131 may store information on electricity measurement related to the demand response resources (200, including the purchased external demand response to resources 600) received from the utility grid management system 500 via the electricity company system communication unit 112, and store information on electricity measurement related to the demand response resources (200, including the purchased external demand response resources 600) which is directly collected from the demand response resources (200, including the purchased external demand response resources 600) via the demand response resources communication unit 113.

The demand response capacity prediction and actual demand response capacity information DB 132 may store a maximum demand response capacity prediction value and an actual demand response capacity for each measurement time calculated by a demand response capacity calculation unit 122.

The demand response resources information DB 133 may store demand response resources state information such as an operation state, an available electricity, an electricity consumption of the demand response resources (200, including the purchased external demand response resources 600) collected via the demand response resources communication unit 113.

The demand response processing unit 120 may include an external demand response resources electricity purchasing unit 121, a demand response capacity calculation unit 122, a demand response resources state monitoring and control unit 123, in order to perform a demand response process according to the electricity demand reduction instruction from the demand response management system 300.

The external demand response resources electricity purchasing unit 121 may determine whether to purchase the external demand response resources 600 based on information on a demand response capacity target value and a demand response capacity prediction value and request and purchase the external demand response resources 600 via the demand response market system 400.

The demand response capacity calculation unit 122 may calculate the maximum demand response capacity prediction value with reference to demand response resources state information of the demand response resources in use (200, including the purchased external demand response resources 600) of the demand response resources information DB 133, and calculate the demand response capacity for each electricity measurement time by using the information on electricity measurement of the utility electricity measurement information DB 131 obtained from the utility grid management system 500 or the demand response resources (200, including the purchased external demand response resources 600).

The demand response resources state monitoring and control unit 123 may monitor the state information of the demand response resources in use (200, including the purchased external demand response resources 600), and appropriately control the demand response resources in use (200, including the purchased external demand response resources 600) in consideration of the demand response capacity target value while performing the demand response process according to the electricity demand reduction instruction. That is, the demand response resources state monitoring and control unit 123 may utilize the external demand response resources 600 through the demand response market system 400 as well as the demand response resources 200 owned by the demand response customer site 950, secure a demand response capacity shortfall that may occur due to unexpected accident such as abnormal operation of the demand response resources owned by the demand response contractor through the trading market of demand response resource, control to exceed the contract amount of demand response, predict maximum demand response capacity after on-line determining a reserve electricity of demand response resources 200 and an available amount electricity reduction, and automatically control the demand response resources to achieve a target value of contract demand response capacity through the prediction result and the calculation of an actual demand response capacity for each measurement time.

Figure 3:
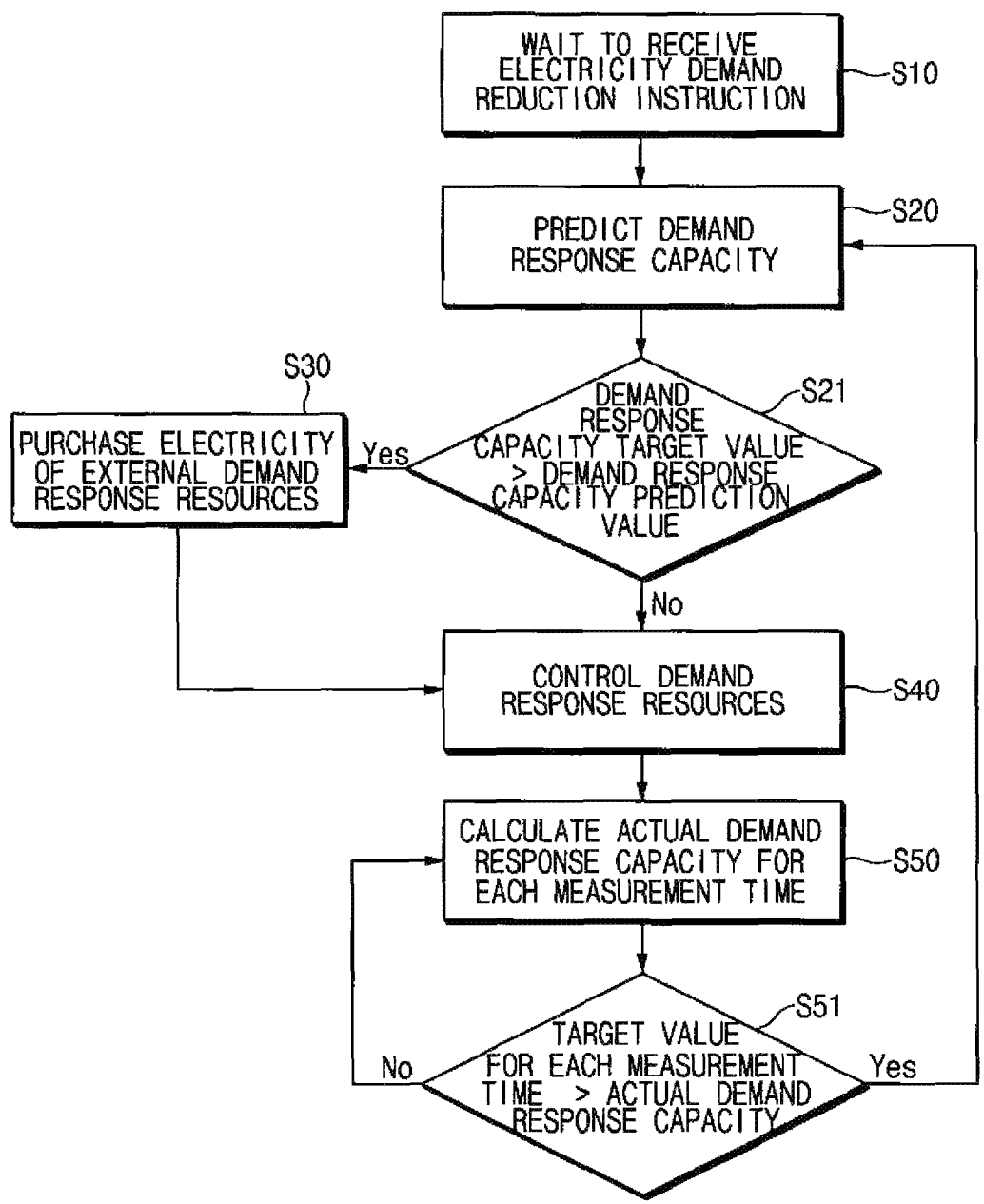
FIG. 3 is a flowchart illustrating an operation of an apparatus for automated electricity demand response based on online trading of demand side resources according to an embodiment of the present disclosure.

Hereinafter, an operation of an apparatus 100 for automated electricity demand response based on online trading demand side resources according to an embodiment of the present disclosure is illustrated with reference to FIG. 3.

First, the apparatus 100 for automated electricity demand response may use the demand response resources (200, including the purchased external demand response resources 600) and control to effectively supply electric power to a certain load in the demand response customer site 950, and wait to receive an electricity demand reduction instruction (message) from the demand response management system 300 (S10).

When receiving the electricity demand reduction instruction from the demand response management system 300, the demand response capacity calculation unit 122 may calculate the maximum demand response capacity prediction value with reference to demand response resources state information related to the demand response resources in use (200, including the purchased external demand response resources 600) of the demand response resources information DB 133, and store the prediction value in demand response capacity prediction and actual demand response capacity information DB 132 (S20).

For example, the demand response capacity calculation unit 122 may calculate the maximum demand response capacity prediction value, as a maximum electricity consumption consumed in a certain period (e.g., one day, one week, one month, a fixed period, and the like), by analyzing the trends, with reference to demand response resources state information such as the operation state (operation time), available power, electricity consumption, and the like for the demand response resources in use (200, including the purchased external demand response resources 600).

The external demand response resources electricity purchasing unit 121 may determine whether to purchase the external demand response resources 600 by comparing a certain demand response capacity target value with a demand response capacity prediction value calculated described above (S21). The demand response capacity target value may be a value arbitrarily set by a user such as a manager or a value set by a contract with a demand response service provider. The demand response capacity target value may be an entire target for a certain period of time (e.g., one day, one week, one month, a fixed period, and the like), and, in addition, a target value for each measurement time (e.g., one hour, two hours, one day, etc) for the demand response in a corresponding time may be further set.

When the demand response capacity target value is higher than the demand response capacity prediction value in step S21, the external demand response resources electricity purchasing unit 121 may request and purchase the electricity of the external demand response resources 600 by sending and receiving a certain data, after a communication connection with the demand response market system 400 through the demand response resources trading market communication unit 111 (S30).

Then, the demand response resources state monitoring and control unit 123 may monitor the state of the demand response resources in use (200, including the purchased external demand response resources 600), and appropriately control the demand response resources in use (200, including the purchased external demand response resources 600) in consideration of the demand response capacity target value while performing the demand response process according to the electricity demand reduction instruction (S40).

For example, the demand response resources state monitoring and control unit 123 may set an electricity demand reduction and electricity generation schedule so that the electricity consumption according to the operation of the demand response resources in use (200, including the purchased external demand response resources 600) may be a demand response capacity target value or less, and may perform the on-line control process for the operation of the demand response resources in use (200, including the purchased external demand response resources 600). When the information such as the electricity price for each time according to the service contract condition is included in the electricity demand reduction request, the demand response resources state monitoring and control unit 123 may set the electricity demand reduction and electricity generation schedule such as the operation time for each time and control the operation of the resources demand, with respect to an internal or external energy storage apparatus, an emergency generator, and an electric power facilities supplied with electricity from an electricity company.

When the demand response resources state monitoring and control unit 123 controls the demand response process, with reference to the utility electricity measurement information DB 131, the demand response capacity calculation unit 122 may calculate the actual demand response capacity (the actual amount of electricity consumption) far each measurement time (e.g., one hour, two hours, one day, etc.) according to the electricity measurement information for the demand response resources (200, including the purchased external demand response resources 600) directly collected from the utility grid management system 500 or the demand response resources (200, including the purchased external demand response resources 600) (S50).

After calculating the actual demand response capacity for each measurement time, the demand response capacity calculation unit 122 may compare a target value for each measurement time for the demand response with the actual demand response capacity for each measurement time, and return to step S20 when the target value is higher to repeat the process for calculating the maximum demand response capacity prediction value. If not, it may return to step S50 to check the actual demand response capacity for each measurement time, and continuously check whether the target value for each measurement time for the demand response is achieved at step S51.

Figure 4:
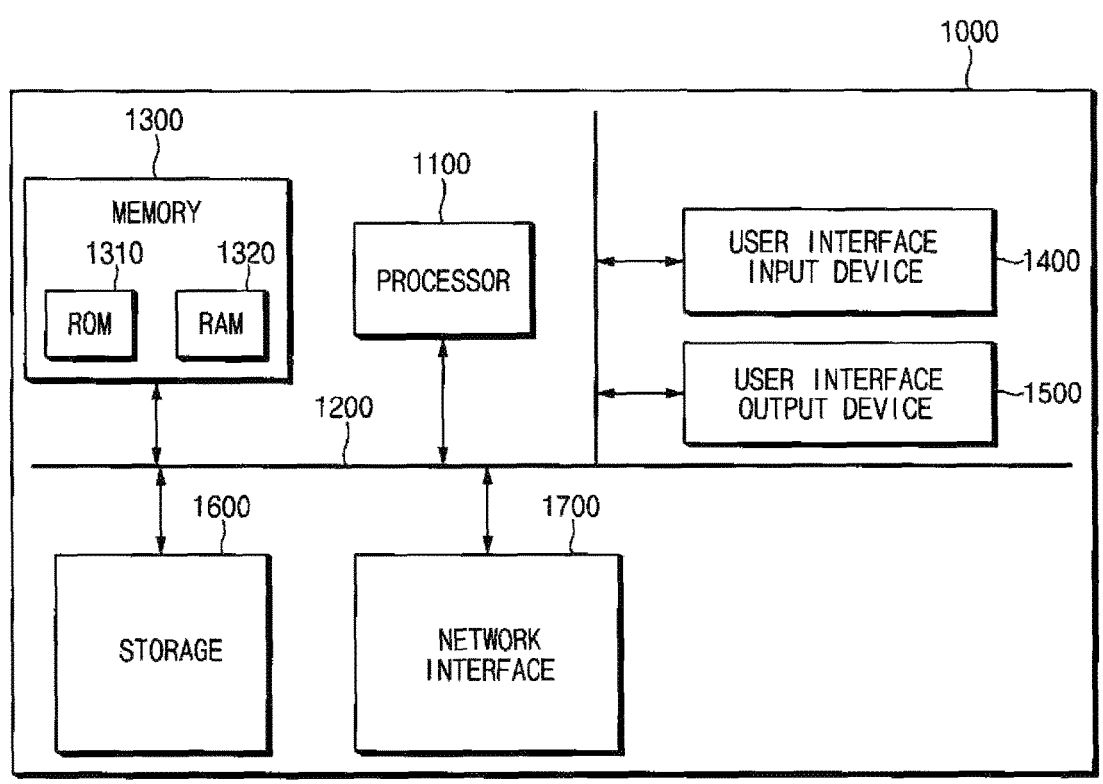
FIG. 4 is a diagram illustrating an example of implementing an apparatus for automated electricity demand response based on online trading of demand side resources according to an embodiment of the present disclosure.

FIG. 4 is a diagram illustrating an example of implementing an apparatus 100 for automated electricity demand response based on online trading of demand side resources according to an embodiment of the present disclosure. The apparatus 100 for automated electricity demand response according to an embodiment of the present disclosure may be implemented in hardware, software, or a combination thereof. For example, the apparatus 100 for automated electricity demand response may be implemented in a computing system 1000 shown in FIG. 4.

The computing system 1000 may include at least one processor 1100 which is connected via a bus 1200, memory 1300, a user interface input device 1400, a user interface output device 1500, a storage 1600, and a network interface 1700. The processor 1100 may be a semiconductor device for performing a processing for instructions stored in a central processing unit (CPU) or the memory 1300 and/or the storage 1600. The memory 1300 and the storage 1600 may include various types of volatile and nonvolatile storage media. For example, the memory 1300 may include a Read Only Memory (ROM) 1310 and Random Access Memory (RAM) 1320.

Thus, the steps of the method or the algorithm described in association with the embodiments disclosed herein may be directly implemented by a hardware, a software module, or a combination of the two executed by the processor 1100. The software module may reside in a storage medium (i.e., in the memory 1300 and/or the storage 1600) such as a RAM memory, a flash memory, a ROM memory, an EPROM memory, an EEPROM memory, a register, a hard disk, a removable disk, and CD-ROM. The exemplary storage medium may be coupled to the processor 1100, and the processor 1100 may read information from the storage medium and write information to the storage medium. Alternatively, the storage medium may be integrated in the processor 1100. The processor and the storage medium may reside in an application specific integrated circuit (ASIC). The ASIC may reside in a user terminal. Alternatively, the processor and the storage medium may reside in the user terminal as an individual component.

As described above, according to the method and the apparatus for automated electricity demand response based on online trading of demand side resources, in the method of accomplishing an electricity demand reduction instruction according to the contract with the demand response service provider in a smart grid environment, it is possible to exceed the contract amount of demand response by securing the shortfall of demand response capacity that may occur due to unexpected accident such as abnormal operation of the demand response resources owned by the demand response contractor through the trading market of demand response resource, by utilizing the external demand response resources through the trading market of demand response resources as well as the demand response resources owned by the demand response contractor.

In addition, it is possible to solve the problem of the non-real-time and the inaccuracy of the conventional demand response resources control method by the direct intervention of a user, by predicting a maximum demand response capacity after on-line determining a reserve electricity of demand response resources and an available amount of electricity reduction, and automatically controlling the demand response resources to achieve a target value of contract demand response capacity through the prediction result and the calculation of an actual demand response capacity for each measurement time.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for automated electricity demand response based on online trading of demand side resources, the apparatus communicating at least one of a demand response resource, a demand response management system, a utility grid management system, and a demand response market system through a communication network including the Internet, the apparatus comprising:
   one or more units being configured and executed by a processor using algorithm associated with least one non-transitory storage device, the units and storage device comprising;
   a communication unit configured to support a communication with at least one of the demand response market system, the demand response management system, the utility grid management system, and the demand response resources in use;
   a database configured to store electricity measurement information related to the demand response resources collected from the utility grid management system or the demand response resources through the communication unit, and to store state information of the demand response resources which being collected from the demand response resources through the communication unit; and
   in response to receipt of an electricity demand reduction request notified from the demand response market system, a demand response processing unit configured to receive an electricity demand reduction instruction message according to a certain demand response service contract condition in the demand response management system, to monitor a state of the demand response resources and to perform a demand response process by setting an electricity demand reduction and electricity generation schedule to make an electricity consumption less than or equal to a demand response capacity target value to perform an on-line control process for the operation of the demand response resources, the demand response process being performed with reference to the electricity measurement information so that the electricity consumption is adjusted according to an operation of the demand response resource,
   wherein the demand response processing unit configured to compare the demand response capacity target value with a maximum demand response capacity prediction value to determine whether to purchase an electricity for an external demand response resource, and request to purchase the electricity to the demand response market system to secure an amount of a shortfall of the demand response capacity.

2. The apparatus of claim 1, wherein the demand response capacity target value is a value set by a user or a value previously set through a contract with a demand response service provider.

3. The apparatus of claim 1, wherein the demand response processing unit comprises:
   a demand response capacity calculation unit configured to calculate a maximum demand response capacity prediction value as a maximum electricity consumption to be consumed during a given period, with reference to the demand response resources state information, and to store the prediction value in the database;
   an external demand response resources electricity purchasing unit configured to determine whether to purchase an electricity for the external demand response resources by comparing the demand response capacity target value with the maximum demand response capacity prediction value; and
   a demand response resources state monitoring and control unit configured to set the electricity demand reduction and electricity generation schedule according to the demand response process to perform the on-line control process for the operation of the demand response resources according to all demand response resources in use including the external demand response resources purchased by the external demand response resources electricity purchasing unit.

4. The apparatus of claim 3, in response to receipt of the demand response capacity target value being higher than the maximum demand response capacity prediction value,
   the external demand response resources electricity purchasing unit is configured to transmit and to receive certain data after connecting communication with the demand response market system through the communication unit, and to request and to purchase the electricity of the external demand response resources.

5. The apparatus of claim 3, wherein the demand response resources state monitoring and control unit is configured to set the electricity demand reduction and electricity generation schedule which represents an operation time for each time with respect to the all demand response resources in use to control an operation of the demand response resources in response to receipt of information on electricity price for each time according to the service contract condition which being included in the electricity demand reduction instruction message.

6. The apparatus of claim 3, wherein the demand response capacity calculation unit is configured to compare an actual demand response capacity for each measurement time calculated according to the electricity measurement information with a preset target value for each measurement time, and to determine whether to repeat to calculate the maximum demand response capacity prediction value, and wherein the determination whether to repeat to calculate the maximum demand response capacity prediction value is performed during the control for the demand response process by the demand response resources state monitoring and control unit.

7. A computer-implemented method for automated electricity demand response based on online trading of demand side resources, the method comprising an apparatus communicating at least one of a demand response resource, a demand response management system, a utility grid management system, and a demand response market system through a communication network including the Internet:
   storing electricity measurement information related to a demand response resources collected from an utility grid management system on a network or a demand response resources in use in a database, and storing state information of the demand response resources which being collected from the demand response resources in the database;
   in response to receipt of an electricity demand reduction request notified from the demand response market system, receiving an electricity demand reduction instruction message according to a certain demand response service contract condition in the demand response management system through the communication network according to an electricity demand reduction request notified from the demand response market system through the communication network; and
   monitoring a state of the demand response resources and performing a demand response process by setting an electricity demand reduction and electricity generation schedule to make an electricity consumption less than or equal to a demand response capacity target value and performing an on-line control process for the operation of the demand response resources, the demand response process being performed with reference to the electricity measurement information so that the electricity consumption is adjusted according to an operation of the demand response resource, wherein performing an on-line control process for the operation of the demand response resources comprises comparing the demand response capacity target value with a maximum demand response capacity prediction value to determine whether to purchase an electricity for an external demand response resource, and requesting to purchase the electricity to the demand response market system to secure an amount of a shortfall of the demand response capacity.

8. The method of claim 7, wherein the demand response capacity target value is a value set by a user or a value previously set through a contract with a demand response service provider.

9. The method of claim 7, wherein performing an on-line control process for the operation of the demand response resources comprises:

calculating a maximum demand response capacity prediction value as a maximum electricity consumption to be consumed during a given period, with reference to the demand response resources state information;

determining whether to purchase an electricity for the external demand response resources by comparing the demand response capacity target value with the maximum demand response capacity prediction value; and setting the electricity demand reduction and electricity generation schedule according to the demand response process to perform the on-line control process for the operation of the demand response resources according to all demand response resources in use including the external demand response resources purchased by the external demand response resources electricity purchasing unit.

10. The method of claim 9, in response to receipt of the demand response capacity target value being higher than the maximum demand response capacity prediction value, requesting and purchasing the electricity of the external demand response resources by transmitting and receiving certain data after connecting communication with the demand response market system through the communication network.

11. The method of claim 9, wherein performing an on-line control process for the operation of the demand response resources comprises setting the electricity demand reduction and electricity generation schedule which represents an operation time for each time with respect to the all demand response resources in use to control an operation of the demand response resources in response to receipt of information on electricity price for each time according to the service contract condition which being included in the electricity demand reduction instruction message.

12. The method of claim 9, when performing the control for the demand response process in performing an on-line control process, calculating a maximum demand response capacity prediction value by comparing an actual demand response capacity for each measurement time calculated according to the electricity measurement information with a preset target value for each measurement time, and determining whether to repeat to calculate the maximum demand response capacity prediction value.

* * * * *